United States Patent
Ibe et al.

(10) Patent No.: US 8,592,852 B2
(45) Date of Patent: Nov. 26, 2013

(54) LIGHT-EMITTING DEVICE AND LIGHTING DEVICE

(75) Inventors: Takahiro Ibe, Kanagawa (JP); Hisao Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 61 days.

(21) Appl. No.: 13/111,091

(22) Filed: May 19, 2011

(65) Prior Publication Data

US 2011/0284913 A1 Nov. 24, 2011

(30) Foreign Application Priority Data

May 21, 2010 (JP) ................................. 2010-117809

(51) Int. Cl.
*H01L 33/00* (2010.01)
*H01J 1/62* (2006.01)

(52) U.S. Cl.
CPC .................................... *H01L 33/00* (2013.01)
USPC ......... 257/99; 257/98; 257/E33.065; 313/506

(58) Field of Classification Search
CPC .......... H01L 33/00; H01L 33/10; H01L 33/36
USPC ....... 257/98, 99, E33.065; 313/503, 505, 506
See application file for complete search history.

(56) References Cited

U.S. PATENT DOCUMENTS

| | | | |
|---|---|---|---|
| 5,369,289 A | 11/1994 | Tamaki et al. | |
| 5,421,908 A | 6/1995 | Yoshida et al. | |
| 5,905,275 A | 5/1999 | Nunoue et al. | |
| 6,157,127 A * | 12/2000 | Hosokawa et al. | 313/506 |
| 6,208,791 B1 | 3/2001 | Bischel et al. | |
| 6,320,633 B1 | 11/2001 | Broer et al. | |
| 6,479,941 B1 | 11/2002 | Abe et al. | |
| 6,515,417 B1 | 2/2003 | Duggal et al. | |
| 6,525,467 B1 | 2/2003 | Eida et al. | |
| 6,538,374 B2 | 3/2003 | Hosokawa | |
| 6,566,808 B1 | 5/2003 | Duggal et al. | |

(Continued)

FOREIGN PATENT DOCUMENTS

| | | |
|---|---|---|
| EP | 1 111 966 A2 | 6/2001 |
| EP | 1 120 838 A2 | 8/2001 |

(Continued)

OTHER PUBLICATIONS

Fun-led organic_led at http://www.fun-led-light.com/organic_led.html Jul. 2012.*

(Continued)

*Primary Examiner* — Nikolay Yushin
(74) *Attorney, Agent, or Firm* — Husch Blackwell LLP

(57) ABSTRACT

To provide a light-emitting device from which uniform light emission can be obtained by providing an auxiliary wiring; a light-emitting device in which a short circuit between electrodes or between an electrode and an auxiliary wiring, which is attributed to a step caused by the auxiliary wiring, hardly occurs; and a light-emitting device which has high reliability by preventing a short circuit. In an EL light-emitting device including an auxiliary wiring, by covering a step caused by the auxiliary wiring is covered with an insulator, a short circuit between electrodes or between an electrode and the auxiliary wiring, which is attributed to the step caused by the auxiliary wiring, is prevented. Thus, the above objects are achieved.

20 Claims, 10 Drawing Sheets

(56) References Cited

U.S. PATENT DOCUMENTS

| | | |
|---|---|---|
| 6,593,691 B2 | 7/2003 | Nishi et al. |
| 6,608,449 B2 | 8/2003 | Fukunaga |
| 6,630,785 B1 | 10/2003 | Lu |
| 6,661,029 B1 | 12/2003 | Duggal |
| 6,700,322 B1 | 3/2004 | Duggal et al. |
| 6,777,871 B2 | 8/2004 | Duggal et al. |
| 6,781,162 B2 | 8/2004 | Yamazaki et al. |
| 6,800,999 B1 | 10/2004 | Duggal et al. |
| 6,841,949 B2 | 1/2005 | Duggal |
| 6,853,011 B2 | 2/2005 | Lin |
| 6,885,030 B2 | 4/2005 | Onozuka et al. |
| 7,161,184 B2 | 1/2007 | Miyagi et al. |
| 7,198,533 B2 | 4/2007 | Duggal et al. |
| 7,221,095 B2 | 5/2007 | Yamazaki et al. |
| 7,576,496 B2 | 8/2009 | Duggal et al. |
| 7,733,441 B2 | 6/2010 | Seo et al. |
| 7,768,210 B2 | 8/2010 | Shiang et al. |
| 2001/0035393 A1 | 11/2001 | Lu et al. |
| 2002/0190661 A1 | 12/2002 | Duggal et al. |
| 2003/0127967 A1 | 7/2003 | Tsutsui et al. |
| 2003/0189401 A1 | 10/2003 | Kido et al. |
| 2003/0222575 A1 | 12/2003 | Yamazaki et al. |
| 2003/0224571 A1 | 12/2003 | Iijima et al. |
| 2004/0027059 A1 | 2/2004 | Tsutsui |
| 2004/0032202 A1 | 2/2004 | Fukunaga |
| 2005/0073247 A1* | 4/2005 | Yamazaki et al. ............ 313/503 |
| 2005/0258436 A1 | 11/2005 | Arai |
| 2006/0119258 A1* | 6/2006 | Sakata et al. ................. 313/504 |
| 2010/0006882 A1 | 1/2010 | Arai |
| 2010/0025716 A1 | 2/2010 | Seo et al. |
| 2010/0026179 A1 | 2/2010 | Seo et al. |

FOREIGN PATENT DOCUMENTS

| | | |
|---|---|---|
| JP | 62-272499 | 11/1987 |
| JP | 63-141293 | 6/1988 |
| JP | 11-97183 | 4/1999 |
| JP | 2001-15268 | 1/2001 |
| JP | 2002-156633 | 5/2002 |
| JP | 2004-14128 | 1/2004 |
| JP | 2004-134282 | 4/2004 |

OTHER PUBLICATIONS

WebArchive at http://web.archive.org/web/20080820173301/http://www.fun-led-light.com/organic_led.html). Aug. 20, 2008.*

* cited by examiner

LIGHT-EMITTING DEVICE AND LIGHTING DEVICE

BACKGROUND OF THE INVENTION

1. Field of the Invention

The present invention relates to a light-emitting device or a lighting device which emits light by electroluminescence.

2. Description of the Related Art

In recent years, a light-emitting element in which a light-emitting organic compound or a light-emitting inorganic compound is used as a light-emitting substance has been actively developed. In particular, a light-emitting element called an electroluminescent (EL) element has a simple structure in which a light-emitting layer containing a light-emitting substance is provided between electrodes and has the following characteristics: its thickness and weight can be reduced; it can respond to input signals fast; and it can be driven at low DC voltage.

Such a light-emitting element is expected to be applied mainly to a display and lighting. As applications to lighting, there are conventional lighting devices such as a filament lamp and a fluorescent lamp which have a point light source and a linear light source, respectively. In contrast, the light-emitting element can provide surface light emission; thus, it is considered that the light-emitting element can be used for manufacturing a lighting device with a nonconventional shape, such as a sheet-like lighting device. Moreover, the light-emitting element has a surface light source; thus, lighting closer to natural light can be easily obtained.

Light-emitting elements utilizing EL emission (the light-emitting element is hereinafter referred to as an EL light-emitting element) are classified, according to a substance contained in a light-emitting layer, into a light-emitting element utilizing emission generated in returning from a singlet excited state to a ground state (i.e., fluorescence) and a light-emitting element utilizing emission generated in returning from a triplet excited state to the ground state (i.e., phosphorescence). Only 25% of the total excitons can be generated as excitons in the single excited state in the EL light-emitting element; thus, examination of light-emitting substances which can utilize the triplet excited state has been actively conducted in order to effectively utilize input electric power.

As a method of increasing power efficiency, reducing driving voltage of an EL light-emitting element is considered for the reason below. In the case where the same amount of current is applied to EL light-emitting elements, the EL light-emitting element to which the current is applied at lower voltage consumes less power than the other EL light-emitting element to which current is applied at higher voltage. However, in general, the luminance of an EL light-emitting element which can be driven at low voltage is significantly changed due to a small change in driving voltage.

In order to obtain sufficient luminous flux from an EL light-emitting element so that the EL light-emitting element is used for lighting, a method of increasing the emission area of the EL light-emitting element is convenient. However, increasing the emission area causes concern of variation in luminance of a light-emitting surface caused by voltage drop of a transparent thin electrode. In particular, an EL light-emitting element which can be driven at low voltage is strongly affected by the voltage drop, and therefore needs countermeasures against the voltage drop.

As the countermeasure, a structure in which a low resistant auxiliary wiring is formed over a transparent electrode has been reported (see Patent Document 1). This method, in which the low resistant auxiliary wiring is formed over the transparent electrode and an inorganic insulating layer is formed over only the auxiliary wiring, allows uniform light emission over the surface of the light-emitting element and a reduction in reactive power over the auxiliary wiring.

[Patent Document 1] Japanese Published Patent Application No. H11-97183

SUMMARY OF THE INVENTION

In the light-emitting device disclosed in Patent Document 1, the inorganic insulating layer is formed only over a top surface of the auxiliary wiring, and a cathode is provided over the auxiliary wiring with the inorganic insulating layer and an EL layer interposed therebetween. Thus, there has been a problem in that a short circuit between the auxiliary wiring and the cathode of an EL light-emitting element easily occurs due to a bump on side surfaces of the auxiliary wiring and the inorganic insulating layer.

The present invention was made in view of the foregoing technical background. Therefore, it is an object of one embodiment of the present invention to provide a light-emitting device from which uniform light emission can be obtained. Moreover, it is an object of one embodiment of the present invention to provide a light-emitting device in which a short circuit between electrodes or between an electrode and an auxiliary wiring, which is attributed to a bump caused by the auxiliary wiring, hardly occurs. Furthermore, it is an object of one embodiment of the present invention to provide a highly reliable light-emitting device by preventing a short circuit.

In order to achieve the above objects, the inventors focused on a bump caused by an auxiliary wiring and came up with a structure in which the bump is covered with an insulating material.

In other words, one embodiment of the present invention is a light-emitting device. The light-emitting device includes an auxiliary wiring formed over an insulating surface; a first electrode formed over the insulating surface so as to cover the auxiliary wiring; an insulator selectively formed over the first electrode so as to cover a bump caused by the auxiliary wiring; an electroluminescent layer for covering the first electrode and the insulator; and a second electrode formed over the electroluminescent layer.

According to the above embodiment of the present invention, the bump of the first electrode, which is caused by the auxiliary wiring, is covered with the insulator, so that a short circuit can be prevented. Thus, a highly reliable light-emitting device can be provided.

Note that the insulator may cover a top surface and a side surface of the bump caused by the auxiliary wiring. When both the top surface and the side surface of the bump are covered, a short circuit can be prevented and a light-emitting device can be provided in which power consumed for emission of light from the electroluminescent layer positioned between the top surface of the auxiliary wiring and the second electrode, which cannot be extracted because it is blocked by the auxiliary wiring, is reduced.

In the above structure, the first electrode may include a conductive high molecule. According to the above embodiment of the present invention, the auxiliary wiring is provided; thus, the first electrode can be used even when it has high resistance. This enables a light-emitting device to be manufactured with high productivity.

In the above structure, the thickness of the first electrode may be less than or equal to 10 nm. According to the above embodiment of the present invention, the auxiliary wiring is patterned earlier than the first electrode and the first electrode is not affected by an etching step of the auxiliary wiring; thus, the first electrode can have a very small thickness less than or equal to 10 nm. Thus, loss of light due to the first electrode can be reduced, which allows a light-emitting device with low power consumption to be provided.

Another embodiment of the present invention is a light-emitting device. The light-emitting device includes a first electrode formed over an insulating surface; an auxiliary wiring formed over the first electrode; an insulator selectively formed so as to cover a bump caused by the auxiliary wiring; an electroluminescent layer for covering the auxiliary wiring, the first electrode, and the insulator; and a second electrode formed over the electroluminescent layer.

According to the above embodiment of the present invention, the bump caused by the auxiliary wiring can be covered with the insulator, so that a short circuit between the second electrode and the auxiliary wiring can be prevented. This enables a highly reliable light-emitting device to be provided.

Note that the insulator may cover a top surface and a side surface of the bump caused by the auxiliary wiring. When both the top surface and the side surface of the bump are covered, a short circuit can be prevented and a light-emitting device can be provided in which power consumed for emission of light over the auxiliary wiring, which cannot be extracted because it is blocked by the auxiliary wiring, is reduced.

Further, the insulator preferably includes a resin. The use of a material including a resin makes it easy to form the insulator in the above structure.

Another embodiment of the present invention is a lighting device including any of the above light-emitting devices.

According to the above embodiment of the present invention, a highly reliable light-emitting device in which voltage drop hardly occurs even when the light-emitting device has a large area can be provided. Moreover, the light-emitting device can be manufactured at low cost. Thus, by applying the present invention to a lighting device, a highly reliable lighting device in which variation in luminance hardly occurs can be provided. Moreover, such a lighting device can be provided at low cost.

Note that in this specification, an "EL layer" refers to a layer provided between a pair of electrodes in a light-emitting element. Thus, a light-emitting layer between electrodes, which contains an organic compound which is a light-emitting substance, is one mode of the EL layer.

In this specification, in the case where a substance A is dispersed in a matrix formed of a substance B, the substance B forming the matrix is referred to as a host material, and the substance A dispersed in the matrix is referred to as a guest material. Note that the substance A and the substance B may each be a single substance or a mixture of two or more kinds of substances.

Note that in this specification, a light-emitting device refers to an image display device, a light-emitting device, or a light source (including a lighting device). Further, the light-emitting device includes any of the following modules in its category: a module in which a connector such as a flexible printed circuit (FPC), a tape automated bonding (TAB) tape, or a tape carrier package (TCP) is attached to a light-emitting device; a module having a TAB tape or a TCP provided with a printed wiring board at the end thereof; and a module having an integrated circuit (IC) directly mounted over a substrate over which a light-emitting element is formed by a chip on glass (COG) method.

According to the present invention, a light-emitting device from which uniform light emission can be obtained can be provided. Moreover, a light-emitting device in which a short circuit between electrodes or between the electrode and an auxiliary wiring, which is attributed to a bump caused by the auxiliary wiring, is prevented can be provided. Furthermore, by preventing a short circuit, a highly reliable light-emitting device from which uniform light emission can be obtained can be provided.

DETAILED DESCRIPTION OF THE INVENTION

Figure 1A:
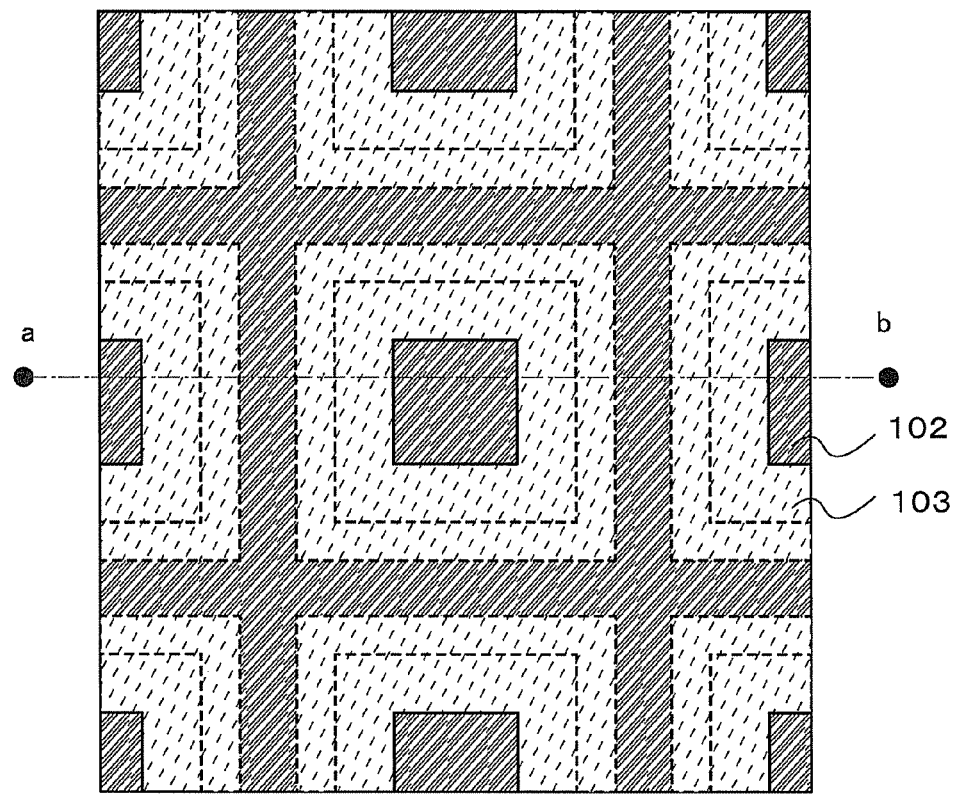
FIG. 1A is a top view illustrating a light-emitting device and FIGS. 1B and 1C are cross-sectional views illustrating the same.

Embodiments will be described in detail with reference to the accompanying drawings. Note that the present invention is not limited to the following description and it will be easily understood by those skilled in the art that the mode and detail can be changed in various ways without departing from the spirit and scope of the present invention. Therefore, the present invention should not be construed as being limited to the description of the embodiments below. Note that in the structures of the present invention described below, the same portions or portions having similar functions are denoted by the same reference numerals in different drawings, and description of such portions is not repeated.

Embodiment 1

Figure 1B:
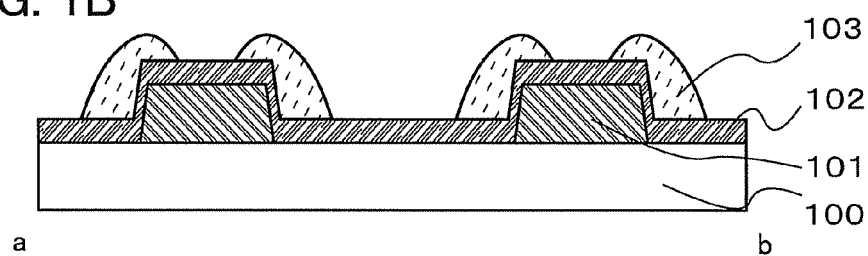
Figure 1C:
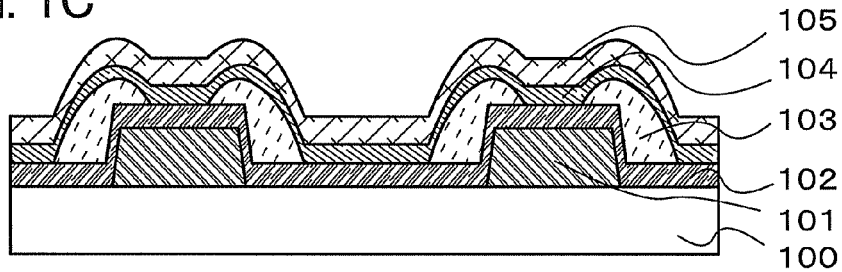

In this embodiment, a light-emitting device having a structure in which an auxiliary wiring is located under a first electrode and a bump of the first electrode, which is caused by the auxiliary wiring, is covered with an insulator will be described with reference to FIGS. 1A to 1C. Note that, although an example in which a substrate having an insulating surface is used as a mode of one having an insulating surface is described in this embodiment, the present invention is not limited thereto.

The light-emitting device described in this embodiment includes an auxiliary wiring 101 over a substrate 100, and a first electrode 102 which covers the substrate 100 and the auxiliary wiring 101. In addition, the light-emitting device includes an insulator 103 which covers a bump caused by the auxiliary wiring 101, over the first electrode 102. Furthermore, the light-emitting device includes an EL layer 104 which covers the first electrode 102 and the insulator 103, and a second electrode 105 over the EL layer 104. Note that FIG. 1A is a top view of the light-emitting device including the substrate 100, the auxiliary wiring 101, the first electrode 102, and the insulator 103; FIG. 1B is a cross-sectional view taken along a-b in FIG. 1A; and FIG. 1C is a cross-sectional view of the light-emitting device including the substrate 100, the auxiliary wiring 101, the first electrode 102, the insulator 103, the EL layer 104, and the second electrode 105.

A light-transmitting substrate is used as the substrate 100. Specifically, a light-transmitting material such as glass, quartz, plastic, polyester, polycarbonate, or an acrylic resin can be used. Further, the substrate 100 may be a flexible substrate. The flexible substrate is a substrate that can be bent, such as a plastic substrate made of polycarbonate, polyarylate, or polyether sulfone. Alternatively, a film (made of polypropylene, polyester, vinyl, polyvinyl fluoride, polyvinyl chloride, or the like), or an inorganic film formed by evaporation can be used. Note that other materials may be used as long as the substrate functions as a support. The shape of the substrate can be square, rectangular, polygonal, circular, or disk-shaped (circle-shaped).

The auxiliary wiring 101 is formed over the substrate 100. As the auxiliary wiring 101, a material having low resistance is preferably used; specifically, a material such as aluminum, copper, or silver can be used. When an aluminum alloy (e.g., Al—Nd or Al—Ti) or a stack of a plurality of metals (e.g., Ti/Al/Ti, Al—Ti/Ti) is used, both low resistance and resistance to high-temperature treatment can be achieved. Alternatively, a material having relatively high resistance such as titanium, tungsten, tantalum, or molybdenum may be used as the auxiliary wiring depending on the usage. The thickness and width of the auxiliary wiring and the interval between the auxiliary wirings are determined in view of variation in EL luminance which is attributed to voltage drop due to the first electrode. Specifically, the auxiliary wiring is preferably provided so that variation in EL luminance due to voltage drop can be suppressed within 10%.

Next, the first electrode 102 is formed over the substrate 100 and the auxiliary wiring 101. At this time, the first electrode 102 is continuously formed without being separated between the adjacent auxiliary wirings. The first electrode 102 is formed of a material and with a thickness which enable transmission of light emitted from the EL layer.

Note that in the present invention, the auxiliary wiring 101 is provided; thus, the first electrode 102 can be used even when it has high resistance. In other words, a conductive high molecule which belongs to a group of material having high resistance can be used for the first electrode 102. As the conductive high molecule, a so-called π-electron conjugated conductive high molecule can be used. For example, polyaniline and/or a derivative thereof, polypyrrole and/or a derivative thereof, polythiophene and/or a derivative thereof, and a copolymer of two or more of aniline, pyrrole, and thiophene or a derivative thereof can be given as the π-electron conjugated conductive high molecule. When the conductive high molecule is used for the first electrode 102, the first electrode 102 can be easily formed by a wet process such as a spin coating method and a hole-injection layer in the EL layer is not needed; thus, a light-emitting device can be manufactured with high productivity.

Figure 3:
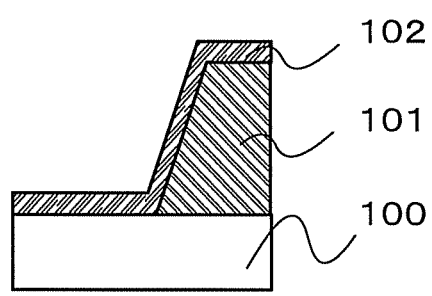
FIG. 3 illustrates a bump included in a light-emitting device of Embodiment 1.

Further, in manufacture of the light-emitting device of this embodiment, the first electrode is not affected by a step of etching the auxiliary wiring because a step of patterning the auxiliary wiring is performed before the first electrode is formed. Thus, even when the first electrode 102 includes a conductive high molecule, the conductive high molecule is not damaged by the step of patterning the auxiliary wiring. Further, the first electrode 102 can be formed to be extremely thin. Specifically, the first electrode 102 can be formed to a thickness less than or equal to 10 nm. In the case where the first electrode 102 is formed to be extremely thin, an edge of the auxiliary wiring is preferably tapered in advance as illustrated in FIG. 3. When the edge of the auxiliary wiring is tapered to have an inclination of 70° to 85°, disconnection of the first electrode can be prevented. The reduction in the thickness of the first electrode 102 makes it possible to reduce light loss due to the first electrode; thus, a light-emitting device with low power consumption can be provided.

Next, the insulator 103 is formed over the first electrode 102 so as to cover the bump caused by the auxiliary wiring 101. As the insulator 103, an inorganic material (e.g., silicon oxide, silicon nitride, or silicon oxynitride), a photosensitive or non-photosensitive organic material (e.g., polyimide, acrylic, polyamide, polyimide amide, resist, or benzocyclobutene), siloxane, or a stack thereof can be used. As an organic material, a positive photosensitive organic resin or a negative photosensitive organic resin can be used.

As examples of a manufacturing method of the insulator 103, a dry process such as a sputtering method, a plasma CVD method, and a vacuum evaporation method and a wet process such as a spin coating method, an ink-jet method, a spray coating method, and a screen printing method are given. The manufacturing method can be selected depending on the material of the insulator 103.

Figure 2A:
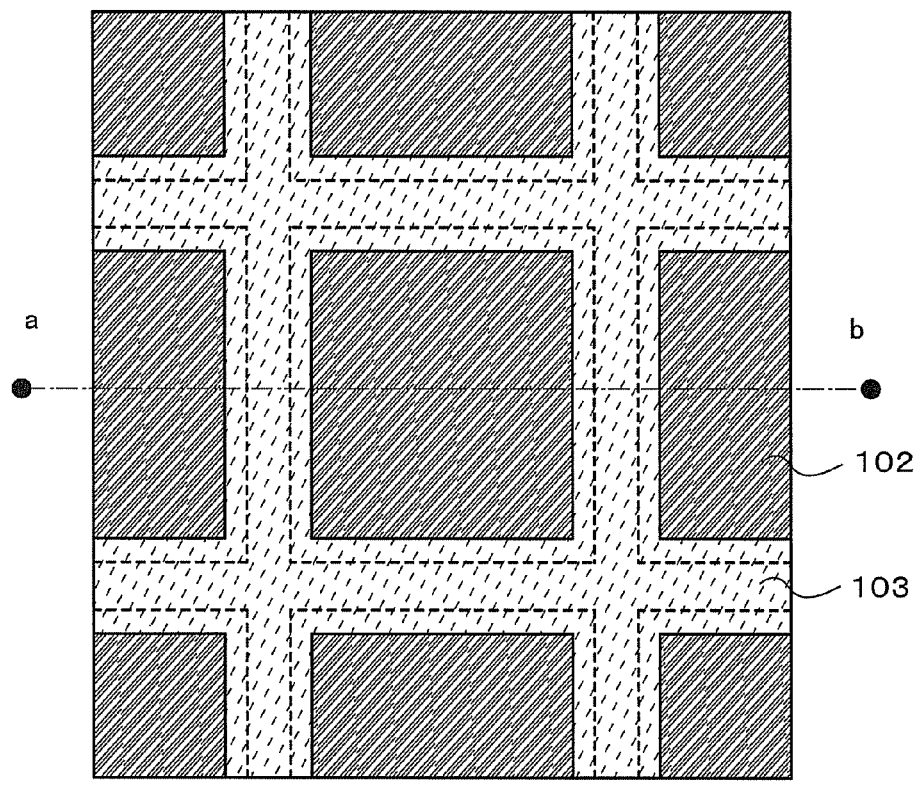
FIG. 2A is a top view illustrating a light-emitting device and FIGS. 2B and 2C are cross-sectional views illustrating the same.
Figure 2B:
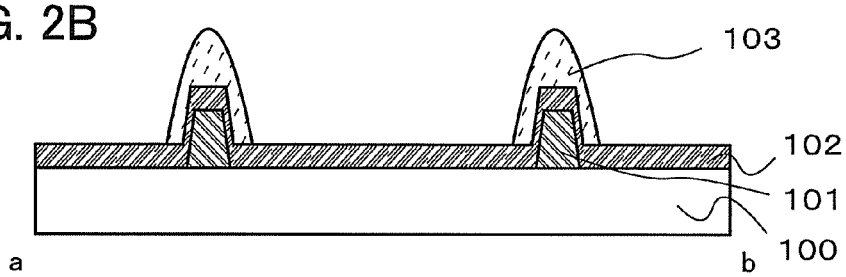
Figure 2C:
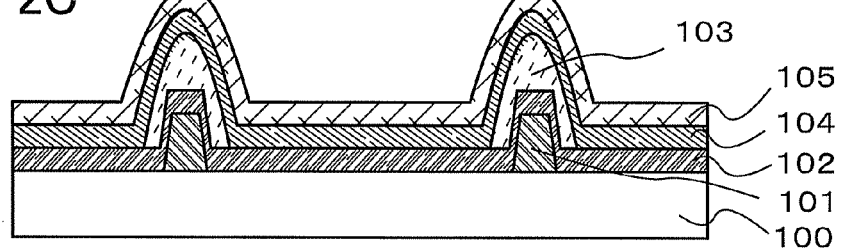

Note that the insulator 103 may cover a top surface and a side surface of the bump caused by the auxiliary wiring 101. FIGS. 2A to 2C illustrate an example in which the top surface and the side surface of the bump caused by the auxiliary wiring are covered with the insulator.

FIG. 2A is a top view illustrating a structure including the substrate 100, the auxiliary wiring 101, the first electrode 102, and the insulator 103. FIG. 2B is a cross-sectional view taken along a-b in FIG. 2A. FIG. 2C is a cross-sectional view illustrating a structure including the substrate 100, the auxiliary wiring 101, the first electrode 102, the insulator 103, the EL layer 104, and the second electrode 105.

When both the top surface and the side surface of the bump caused by the auxiliary wiring 101 are covered with the insulator 103 as described above, a short circuit can be prevented, and a light-emitting device can be provided in which power consumed for emission of light from the EL layer positioned between the top surface of the auxiliary wiring and the second electrode, which cannot be extracted because it is blocked by the auxiliary wiring, is reduced.

Figure 4:
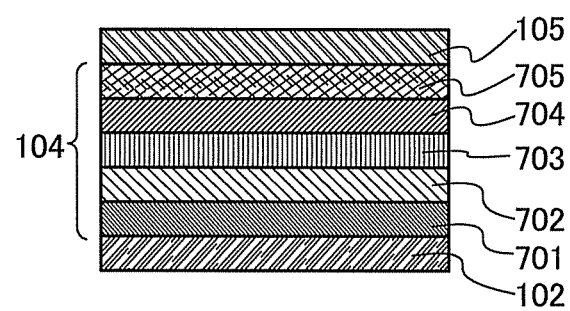
FIG. 4 illustrates an EL layer.

The EL layer 104 is formed over the first electrode 102 and the insulator 103, and the second electrode 105 is formed over the EL layer 104. Now, an EL element structure including the first electrode, the EL layer, and the second electrode will be described in detail with reference to FIG. 4 and FIG. 5.

In the case where the first electrode 102 is an anode, the first electrode 102 can be formed using indium oxide ($In_2O_3$), an alloy of indium oxide and tin oxide ($In_2O_3$—$SnO_2$; ITO), or the like by a sputtering method, a vacuum evaporation method, or the like. An alloy of indium oxide and zinc oxide ($In_2O_3$—ZnO) may be used. In addition, zinc oxide (ZnO) is also an appropriate material. Moreover, zinc oxide to which gallium (Ga) is added (ZnO:Ga) in order to increase conductivity and light transmittance with respect to visible light, or the like can be used Films of these conductive metal oxides are usually formed by a sputtering method; however, a sol-gel method or the like may be used. Further, gold (Au), platinum (Pt), nickel (Ni), tungsten (W), chromium (Cr), molybdenum (Mo), iron (Fe), cobalt (Co), copper (Cu), palladium (Pd), titanium (Ti), a nitride of a metal material (e.g., titanium nitride), and the like can be given. Note that in the case of using a metal material, the first electrode 102 can be formed to be thin as appropriate so that it can transmit light. In the case where the first electrode 102 is a cathode, an extremely thin film of a material with a low work function such as aluminum can be used. Alternatively, a stacked structure of a thin film of such a substance and a transparent conductive film can be employed.

There is no particular limitation on the stacked structure of the EL layer 104. The EL layer 104 may include a layer containing a substance with high electron-transport properties or a layer containing a substance with high hole-transport properties, a layer containing a substance with high electron-injection properties, a layer containing a substance with high hole-injection properties, a layer containing a bipolar substance (a substance with high electron- and hole-transport properties), and the like in appropriate combination. For example, the EL layer 104 can be formed in an appropriate combination of a hole-injection layer, a hole-transport layer, a light-emitting layer, an electron-transport layer, an electron-injection layer, and the like. In this embodiment, a structure of the EL layer 104, which includes a hole-injection layer 701, a hole-transport layer 702, a light-emitting layer 703, an electron-transport layer 704, and an electron-injection layer 705, will be described in this embodiment (see FIG. 4). Specific materials to form each of the layers will be given below.

The hole-injection layer 701 is a layer which is provided in contact with an anode and contains a substance with high hole-injection properties. Molybdenum oxide, vanadium oxide, ruthenium oxide, tungsten oxide, manganese oxide, or the like can be used. Alternatively, the hole-injection layer 701 can be formed using a phthalocyanine-based compound such as phthalocyanine (abbreviation: $H_2Pc$) or copper phthalocyanine (abbreviation: CuPc); an aromatic amine compound such as 4,4'-bis[N-(4-diphenylaminophenyl)-N-phenylamino]biphenyl (abbreviation: DPAB) or N,N'-bis[4-[bis(3-methylphenyl)amino]phenyl]-N,N'-diphenyl-[1,1'-biphenyl]-4,4'-diamine (abbreviation: DNTPD); a high molecule such as poly(ethylenedioxythiophene)/poly(styrenesulfonic acid) (PEDOT/PSS); or the like.

Alternatively, for the hole-injection layer 701, a composite material in which an acceptor substance is mixed with a substance with high hole-transport properties. Note that by using such a material in which an acceptor substance is mixed with a substance with high hole-transport properties, a material to be used to form an electrode can be selected regardless of the work function of the electrode. In other words, besides a material with a high work function, a material with a low work function may also be used as the first electrode 102. As examples of the acceptor substance, 7,7,8,8-tetracyano-2,3,5,6-tetrafluoroquinodimethane (abbreviation: $F_4$-TCNQ), chloranil, and the like can be given. In addition, transition metal oxides can be given. In addition, oxides of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of their high electron-accepting properties. Among these, molybdenum oxide is especially preferable because it is stable in the air, has a low hygroscopic property, and is easily handled.

As the substance with high hole-transport properties used for the composite material, any of a variety of compounds such as an aromatic amine compound, a carbazole derivative, an aromatic hydrocarbon, or a high molecular weight compound (e.g., an oligomer, a dendrimer, or a polymer) can be used. The organic compound used for the composite material is preferably an organic compound with high hole-transport properties. Specifically, a substance having a hole mobility of $10^{-6}$ cm$^2$/Vs or higher is preferably used. Note that other substances may be used as long as the substances have higher hole-transport properties than electron-transport properties.

The organic compounds which can be used for the composite material will be specifically given below.

As examples of the aromatic amine compound, the following can be given: N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-biphenyl]-4,4'-diamine (abbreviation: DNTPD), 1,3,5-tris[N-(4-diphenylaminophenyl)-N-phenylamino]benzene (abbreviation: DPA3B), and the like.

As examples of the carbazole derivative which can be used for the composite material, the following can be given specifically: 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

In addition, as other examples of the carbazole derivative which can be used for the composite material, the following can be given: 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 1,4-bis[4-(N-carbazolyl)phenyl]-2,3,5,6-tetraphenylbenzene, or the like.

As examples of the aromatic hydrocarbon which can be used for the composite material, the following can be given: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Besides, pentacene, coronene, or the like can be used. As given above, an aromatic hydrocarbon which has a hole mobility of $1 \times 10^{-6}$ cm$^2$/Vs or higher and has 14 to 42 carbon atoms is more preferable.

Note that the aromatic hydrocarbon which can be used for the composite material may have a vinyl skeleton. As examples of the aromatic hydrocarbon having a vinyl group, the following can be given: 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Further, the following can be given: high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N-bis(phenyl)benzidine] (abbreviation: Poly-TPD).

The hole-transport layer 702 is a layer which contains a substance with high hole-transport properties. As examples of the substance with high hole-transport properties, the following can be given: aromatic amine compounds such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), and the like. The substances given here are mainly ones having a hole mobility of $10^{-6}$ cm$^2$/Vs or higher. However, other substances may be used as long as the substances have higher hole-transport properties than electron-transport properties. Note that the layer which contains a substance with high hole-transport properties is not limited to a single layer, and may be a stack of two or more layers which contain any of the substances given above.

Alternatively, a high molecular compound such as poly(N-vinylcarbazole) (abbreviation: PVK) or poly(4-vinyltriphenylamine) (abbreviation: PVTPA) can be used for the hole-transport layer 702.

The light-emitting layer 703 is a layer which contains a light-emitting substance. The light-emitting layer 703 may be either a so-called light-emitting layer of a single film containing an emission center material as its main component or a so-called host-guest type light-emitting layer in which an emission center material is dispersed in a host material.

There is no limitation on the emission center material to be used, and a known material which emits fluorescence or phosphorescence can be used. As examples of the fluorescent material, the following can be given: in addition to N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and the like, fluorescent materials with an emission wavelength greater than or equal to 450 nm, such as 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N",N",N"',N"'-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM). As examples of the phosphorescent materials, the following can be given: in addition to bis[2-(4',6'-difluorophenyl)pyridinato-N,C$^{2'}$]iridium(III)tetrakis(1-pyrazolyl)borate (abbreviation: FIr6), there are phosphorescent materials with an emission wavelength in the range of 470 nm to 500 nm, such as bis[2-(4',6'-difluorophenyl)pyridinato-N,C$^{2'}$]iridium(III) picolinate (abbreviation: FIrpic), bis[2-(3',5'-bistrifluoromethylphenyl)pyridinato-N,C$^{2'}$]iridium(III)picolinate (abbreviation: Ir(CF$_3$ppy)$_2$(pic)), and bis[2-(4',6'-difluorophenyl)pyridinato-N,C$^{2'}$]iridium(III)acetylacetonate (abbreviation: FIracac); phosphorescent materials with an emission wavelength greater than or equal to 500 nm (materials which emit green light), such as tris(2-phenylpyridinato)iridium(III) (abbreviation: Ir(ppy)$_3$), bis(2-phenylpyridinato)iridium(III) acetylacetonate (abbreviation: Ir(ppy)$_2$(acac)), tris(acetylacetonato)(monophenanthroline)terbium(III) (abbreviation: Tb(acac)$_3$(Phen)), bis(benzo[h]quinolinato)iridium(III) acetylacetonate (abbreviation: Ir(bzq)$_2$(acac)), bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III) acetylacetonate (abbreviation: Ir(bt)$_2$(acac)), bis[2-(2'-benzo[4,5-a]thienyl)pyridinato-N,C$^{3'}$]iridium(III) acetylacetonate (abbreviation: Ir(btp)$_2$(acac)), bis(1-phenylisoquinolinato-N,C$^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrinatoplatinum(II) (abbreviation: PtOEP), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (Eu(TTA)$_3$(Phen)); and the like. The light-emitting substances can be selected from the materials given above or other known materials in consideration of the emission color of each of the light-emitting elements.

In the case of using a host material, as examples of the host material, the following can be given: metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)-tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as NPB (or α-NPD), TPD, and BSPB. In addition, condensed polycyclic aromatic compounds such as anthracene derivatives, phenanthrene derivatives, pyrene derivatives, chrysene derivatives, and dibenzo[g,p]chrysene derivatives are given. Specific examples of the condensed polycyclic aromatic compound include 9,10-diphenylanthracene (abbreviation: DPAnth), N,N-diphenyl-9-[4-(10-phenyl-9-anthryl)phenyl]-9H-carbazol-3-amine (abbreviation: CzAlPA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetramine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyl)tripyrene (abbreviation: TPB3), and the like. From these materials or other known materials, a material may be selected which has a larger energy gap (or a triplet energy if the material emits phosphorescence) than an emission center material dispersed in the material and which has transport properties as needed for each layer.

The electron-transport layer 704 is a layer which contains a substance with high electron-transport properties. The electron-transport layer 704 is a layer which is formed of, for example, a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq), or the like. A metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances mentioned here are mainly ones having a hole mobility of $10^{-6}$ cm$^2$/Vs or higher. Note that other substances may be used for the electron-transport layer 704 as long as the substances have higher electron-transport properties than hole-transport properties.

Further, the electron-transport layer 704 is not limited to a single layer and may be a stack of two or more layers containing the substances given above.

Further, a layer for controlling transport of electrons may be provided between the electron-transport layer 704 and the light-emitting layer 703. Specifically, the layer is formed by adding a small amount of substance with high electron trapping properties to the material with high electron-transport properties given above. The layer controls transport of electrons, which enables adjustment of carrier balance. Such a structure is very effective in suppressing problems (e.g., a reduction in element lifetime) caused by a phenomenon in which an electron passes through the light-emitting layer 703.

For the electron-injection layer 705, an alkali metal, an alkaline-earth metal, or a compound thereof such as lithium fluoride (LiF), cesium fluoride (CsF), or calcium fluoride (CaF$_2$) can be used. For example, a layer which contains a substance with electron-transport properties and an alkali metal, an alkaline earth metal, or a compound thereof, such as a layer of Alq which contains magnesium (Mg), can be used. Note that a layer which contains an electron-transport substance and further contains an alkali metal or an alkaline earth metal is preferably used for the electron-injection layer 705, in which case electron injection from the second electrode 105 can be performed efficiently.

In the case of using the second electrode 105 as a cathode, a metal, an alloy, an electrically conductive compound, a mixture thereof, or the like having a low work function (specifically, 3.8 eV or lower) can be used as a substance for the second electrode 105. As typical examples of such a cathode material, an element that belongs to Group 1 or 2 of the periodic table, that is, an alkali metal such as lithium (Li) or cesium (Cs), or an alkaline earth metal such as magnesium (Mg), calcium (Ca), or strontium (Sr); an alloy containing any of these (such as MgAg or AlLi); a rare earth metal such as europium (Eu) or ytterbium (Yb); an alloy containing such a rare earth metal; and the like can be given. Note that when the electron-injection layer 705 is provided between the cathode and the electron-transport layer 704, the cathode can be formed using any of a variety of conductive materials such as Al, Ag, ITO, or indium oxide-tin oxide containing silicon or silicon oxide, regardless of its work function. These conductive materials can be deposited by a sputtering method, a vacuum evaporation method, or the like.

In the case of using the second electrode 105 as an anode, a metal, an alloy, an electrically conductive compound, a mixture thereof, or the like having a high work function (specifically, 4.0 eV or higher) is preferably used. Specifically, for example, indium oxide-tin oxide (indium tin oxide; ITO), indium oxide-tin oxide containing silicon or silicon oxide, indium oxide-zinc oxide (indium zinc oxide; IZO), indium oxide containing tungsten oxide and zinc oxide (IWZO), and the like can be given. Films of these conductive metal oxides are usually formed by a sputtering method; however, they may be formed by a sol-gel method or the like. For example, a film of indium oxide-zinc oxide (IZO) can be formed by a sputtering method using a target in which zinc oxide is added to indium oxide at 1 wt % to 20 wt %. A film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride (TiN)), and the like can be given. When the above composite material is provided in contact with the anode, a material for the electrode can be selected regardless of its work function.

Figure 5:
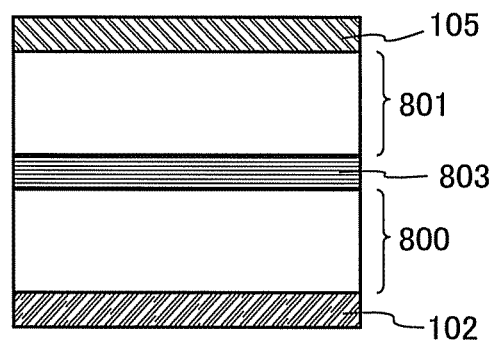
FIG. 5 illustrates an EL layer.

Note that a plurality of the above EL layers 104 may be stacked between the first electrode 102 and the second electrode 105 as illustrated in FIG. 5. In that case, a charge generation layer 803 is preferably provided between a first EL layer 800 and a second EL layer 801 which are stacked. The charge generation layer 803 can be formed of the above composite material. Further, the charge generation layer 803 may have a stacked structure including a layer containing the composite material and a layer containing another material. In that case, as the layer containing another material, a layer containing an electron donating substance and a substance with high electron-transport properties, a layer formed of a transparent conductive film, or the like can be used. As for a light-emitting element having such a structure, problems such as energy transfer and quenching hardly occur, and a light-emitting element which has both high emission efficiency and a long lifetime can be easily obtained due to expansion in the choice of materials. Moreover, a light-emitting element which provides phosphorescence from one of the EL layers and fluorescence from the other of the EL layers can be easily obtained. Note that this structure can be combined with any of the above-described structures of the EL layer.

The structure illustrated in FIG. 5 is particularly preferable for obtaining white light emission. A lighting device with high quality can be manufactured by combining the structure illustrated in FIG. 5 with the structure illustrated in FIG. 4.

Figure 6A:
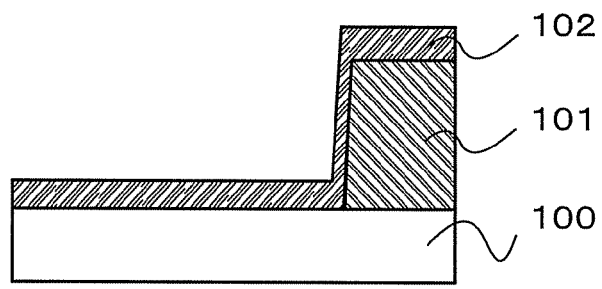
FIGS. 6A to 6C are views for illustrating the light-emitting device of Embodiment 1.
Figure 6B:
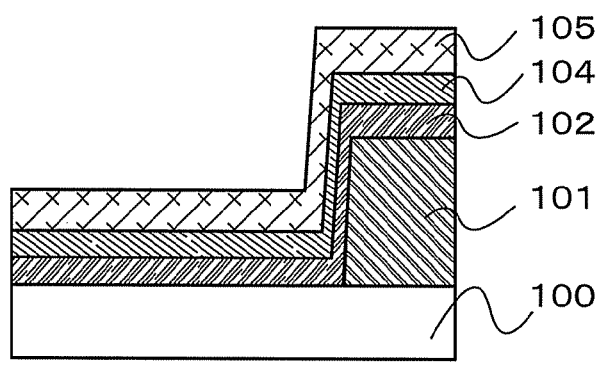
Figure 6C:
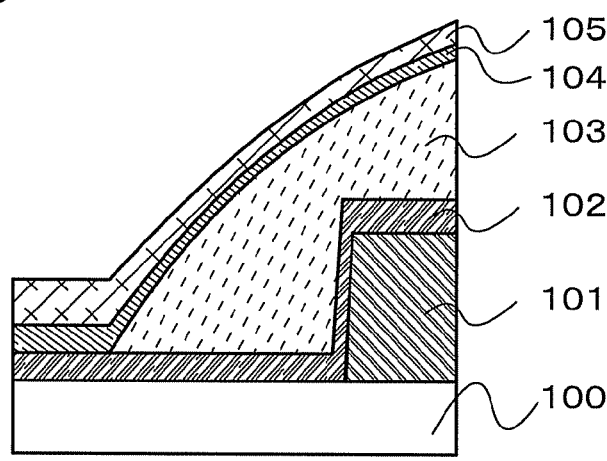

FIGS. 6A to 6C are used to explain that the use of this embodiment makes it possible to cover the bump caused by the auxiliary wiring and to prevent a short circuit at an EL layer.

FIG. 6A illustrates a structure in which the auxiliary wiring 101 and the first electrode 102 are formed over the substrate 100. The thickness of the first electrode 102 on a side surface portion of the auxiliary wiring 101 is small.

FIG. 6B illustrates a structure in which an insulator is not formed and the EL layer 104 and the second electrode 105 are formed. The thickness of the EL layer 104 on a side surface portion of the first electrode 102 is small; thus, a short circuit easily occurs between the first electrode 102 and the second electrode 105.

FIG. 6C illustrates a structure in which after the first electrode 102 is formed, the insulator 103 is formed, the EL layer 104 is formed over the first electrode 102 and the insulator 103, and furthermore the second electrode 105 is formed over the EL layer 104. A bump of the first electrode 102, which is caused by the auxiliary wiring 101, is covered with the insulator 103; thus, electrical connection is not made at the bump caused by the auxiliary wiring. Thus, a short circuit between the first electrode 102 and the second electrode 105 at a side surface portion of the bump can be prevented.

In the light-emitting device described in this embodiment, a short circuit between the electrodes, which is attributed to the bump caused by the auxiliary wiring, can be prevented and uniform light emission can be obtained by providing the auxiliary wiring. Thus, the light-emitting device can have high reliability. Moreover, the use of the auxiliary wiring makes it possible to suppress voltage drop due to relatively high resistance of the first electrode; thus, the light-emitting device has less variation in EL luminance and can be provided at low cost.

In this embodiment, the structures in each of which the auxiliary wiring is formed over the substrate, and the first electrode is formed over the auxiliary wiring are described. In the structures, the substrate is located below the auxiliary wiring; thus, the auxiliary wiring can be etched without consideration of the influence on the base. Moreover, since the first electrode is formed after the auxiliary wiring is etched, etching of the auxiliary wiring does not affect the first electrode. In contrast, in a structure in which the first electrode is formed over the substrate and the auxiliary wiring is formed over the first electrode, the first electrode might be removed due to a step of etching the auxiliary wiring in the case where the first electrode is very thin. In other words, the structure of the present invention allows the influence of variation caused at the time of etching the auxiliary wiring to be reduced and a highly reliable light-emitting device to be provided.

In the light-emitting device of this embodiment, a transparent conductive film having high resistance can be used; thus, the first electrode can include a conductive high molecule. This enables a light-emitting device to be manufactured with high productivity.

Further, in the light-emitting device described in this embodiment, etching of the auxiliary wiring does not affect the first electrode; thus, the first electrode can be formed to have an extremely small thickness, for example, a thickness less than or equal to 10 nm. This enables a light-emitting device which has little loss of light in the first electrode and has high quality to be provided.

Note that this embodiment can be combined with any of the other embodiments described in this specification as appropriate.

Embodiment 2

Figure 7:
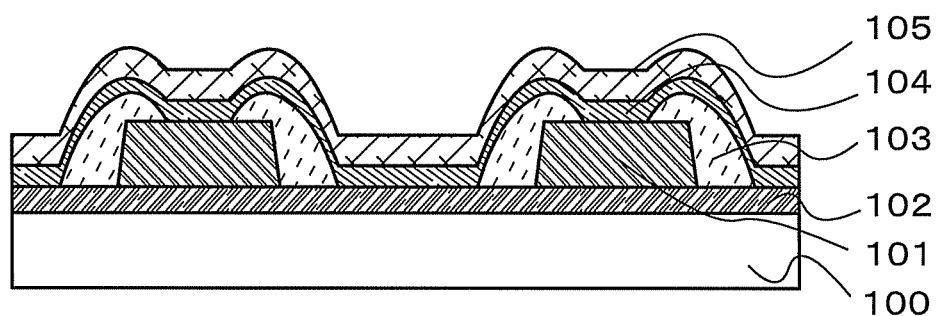
FIG. 7 illustrates a light-emitting device of Embodiment 2.

In this embodiment, a light-emitting device employing a structure in which an auxiliary wiring is formed over a first electrode and a bump caused by the auxiliary wiring is covered with an insulator will be described with reference to FIG. 7.

The light-emitting device described in this embodiment includes the first electrode 102 over the substrate 100, and the auxiliary wiring 101 over the first electrode 102. Moreover, the light-emitting device includes the insulator 103 which covers a bump caused by the auxiliary wiring 101. Furthermore, the light-emitting device includes the EL layer 104 which covers the auxiliary wiring 101, the first electrode 102, and the insulator 103, and the second electrode 105 over the EL layer 104.

The description in Embodiment 1 can be applied to components described in this embodiment; therefore, repetitive description is omitted in detailed description of each component.

In the structure to which this embodiment is applied, the bump caused by the auxiliary wiring 101 is covered with the insulator 103; thus, electrical connection with the second electrode is not made at the bump caused by the auxiliary wiring. Thus, a short circuit between the second electrode and the side surface of the auxiliary wiring can be prevented.

Figure 8:
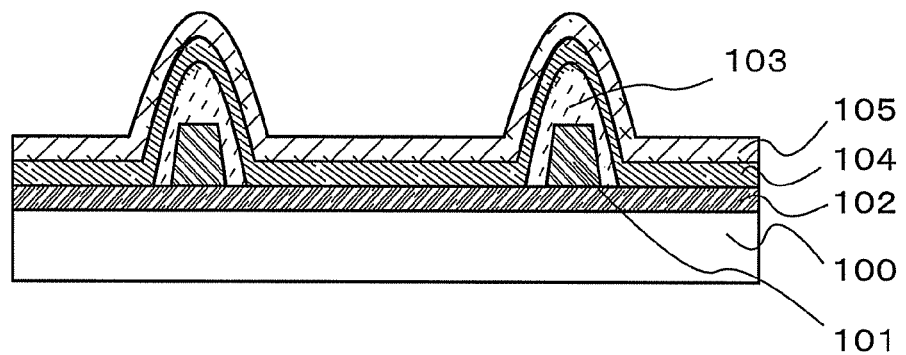
FIG. 8 illustrates a light-emitting device of Embodiment 3.

Note that the insulator 103 may cover both a top surface and a side surface of the bump caused by the auxiliary wiring 101, as illustrated in FIG. 8. When both the top surface and the side surface of the bump caused by the auxiliary wiring are covered as described above, a light-emitting device in which reactive power generated over the top surface of the auxiliary wiring is suppressed can be provided.

The use of the present invention makes it possible to prevent a short circuit between the electrode and the auxiliary wiring, which is attributed to a bump caused by the auxiliary wiring, and to provide a highly reliable light-emitting device.

Note that this embodiment can be combined with any of the other embodiments described in this specification as appropriate.

Embodiment 3

In this embodiment, light-emitting devices in which the insulators described in Embodiments 1 and 2 are formed by a wet process will be described with reference to FIGS. 9A and 9B.

Figure 9A:
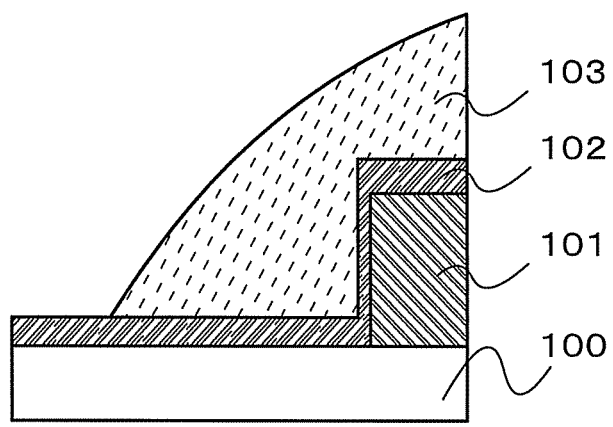
FIGS. 9A and 9B are views for illustrating the light-emitting device of Embodiment 3.
Figure 9B:
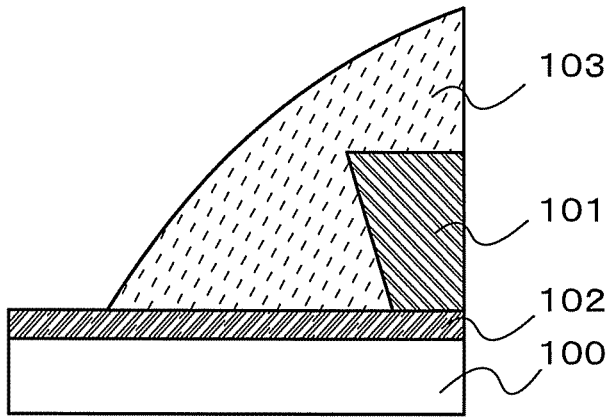

FIG. 9A illustrates the light-emitting device described in Embodiment 1, which has a structure in which the auxiliary wiring 101 is formed over the substrate 100, the first electrode 102 for covering the substrate 100 and the auxiliary wiring 101 is formed, and the insulator 103 for covering a bump caused by the auxiliary wiring 101 is formed over the first electrode 102. In FIG. 9A, in particular, an edge of the auxiliary wiring 101 is perpendicular to the substrate. FIG. 9B illustrates the light-emitting device described in Embodiment 2, which has a structure in which the first electrode 102 is formed over the substrate 100, the auxiliary wiring 101 is formed over the first electrode 102, and the insulator 103 is formed so as to cover a top surface and a side surface of the auxiliary wiring 101. In FIG. 9B, in particular, an edge of the auxiliary wiring 101 is reverse tapered.

A wet process is a method of applying a material in a liquid state onto a substrate surface. A film can be formed on a top surface and a side surface of a component on the substrate surface depending on application liquid and the wettability of the substrate surface. In other words, the use of the wet process makes it possible to favorably cover a steep slope or a reverse tapered slope. For the wet process, any of the following methods can be employed: a spin coating method, a roll coating method, a spray method, a casting method, a dipping method, a droplet discharge (ejection) method (an ink-jet method), a dispenser method, a variety of printing methods (a method by which a desired pattern can be formed, such as screen (stencil) printing, offset (planographic) printing, letterpress printing, or gravure (intaglio) printing, and the like.

Note that it is preferable that a material for the insulator which is formed by a wet process include a resin. As the material for the insulator, which include a resin, a photosensitive or non-photosensitive organic material (e.g., polyimide, acrylic, polyamide, polyimide amide, resist, or benzocyclobutene), a siloxane resin, or the like can be used. In particular, when a positive photosensitive organic resin is used, a bump caused by the auxiliary wiring can be easily covered.

The use of the structures described in this embodiment makes it possible to favorably cover a bump caused by the auxiliary wiring and to prevent a short circuit in a light-emitting device from which uniform light emission can be obtained by providing the auxiliary wiring. Thus, the light-emitting device can have high reliability. Moreover, a material containing an organic substance is used as the insulator, whereby the bump caused by the auxiliary wiring can be easily covered; thus, the light-emitting device can be manufactured with high productivity.

Note that this embodiment can be combined with any of the other embodiments described in this specification as appropriate.

Embodiment 4

In this embodiment, a lighting device in which the light-emitting device manufactured according to one embodiment of the present invention is used will be described with reference to FIGS. 10A and 10B.

Figure 10A:
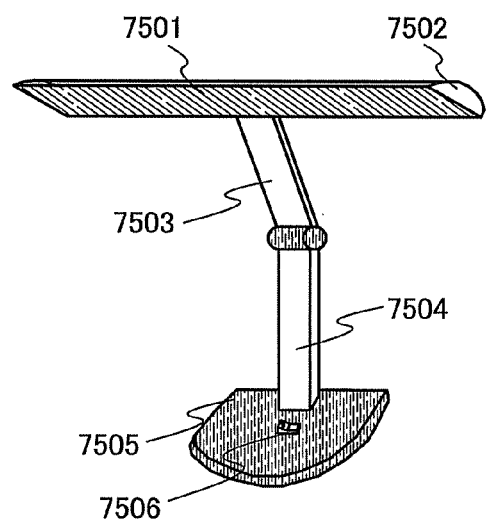
FIGS. 10A and 10B illustrate lighting devices.

FIG. 10A illustrates a lighting device (desk lamp), which includes a lighting portion 7501, a shade 7502, an adjustable arm 7503, a support 7504, a base 7505, and a power switch 7506. Note that the lighting device is manufactured by using a light-emitting device, which is manufactured according to one embodiment of the present invention, for the lighting portion 7501. Note that the lighting device encompasses ceiling lights (ceiling-fixed lighting devices), wall lights (wall-hanging lighting devices), and the like, as well as the desk lamp illustrated in FIG. 10A.

Note that in the light-emitting device to which one embodiment of the present invention is applied, generation of defects attributed to a bump caused by an auxiliary wiring is reduced. Thus, by using the light-emitting device for the lighting portion 7501 of the lighting device (desk lamp), the lighting device (desk lamp) can have high reliability. Moreover, the lighting device can be manufactured with high yield, and thus can be provided at low cost.

Figure 10B:
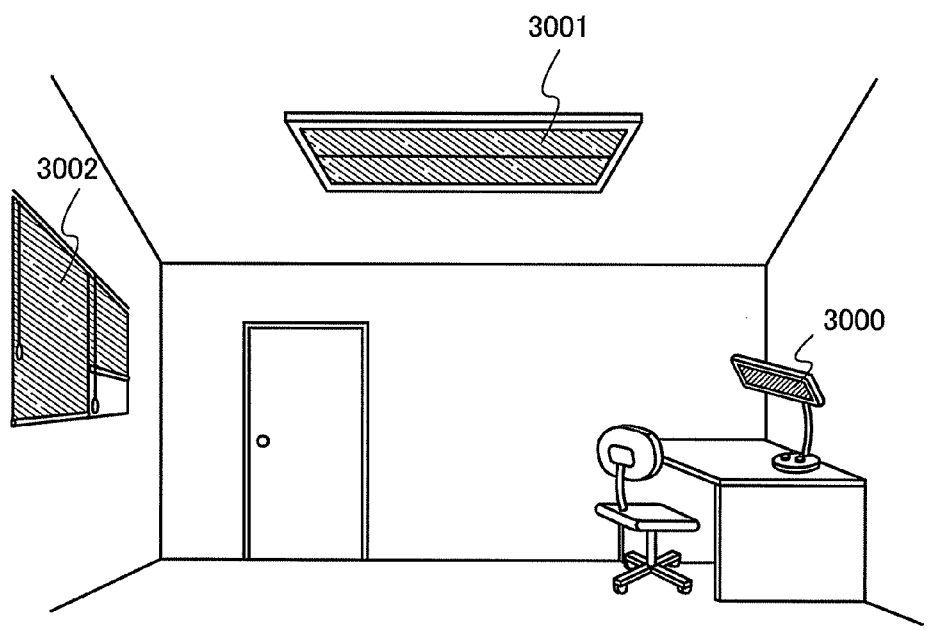

FIG. 10B illustrates an example in which a light-emitting device to which one embodiment of the present invention is applied is used for an interior lighting device. The light-emitting device of one embodiment of the present invention is advantageous in increasing the area, and thus can be used as a lighting device having a large area as illustrated by a ceiling light 3001. In addition, the light-emitting device can be used for a wall-hanging lighting device 3002. Note that in the light-emitting device to which one embodiment of the present invention is applied, generation of defects attributed to a bump caused by an auxiliary wiring is reduced. Thus, by using the light-emitting device, a highly reliable lighting device can be provided. Moreover, a lighting device can be manufactured with high yield, and thus can be provided at low cost. As illustrated in FIG. 10B, a desk lamp 3000 illustrated in FIG. 10A may be used together in a room provided with the interior lighting device.

This application is based on Japanese Patent Application serial no. 2010-117809 filed with the Japan Patent Office on May 21, 2010, the entire contents of which are hereby incorporated by reference.

What is claimed is:

1. A light-emitting device comprising:
    an auxiliary wiring over an insulating surface;
    a first electrode over the auxiliary wiring;
    an insulator over the first electrode to cover a first step and a second step of a bump caused by the auxiliary wiring;
    an electroluminescent (EL) layer over the first electrode; and
    a second electrode over the EL layer,
    wherein the first step of the bump is overlapped with a first side surface of the auxiliary wiring,
    wherein the second step of the bump is overlapped with a second side surface of the auxiliary wiring,
    wherein the first side surface of the auxiliary wiring is opposed to the second side surface of the auxiliary wiring,
    wherein a region between the first step and the second step of the bump is overlapped with the bump, and
    wherein the first electrode is in contact with the EL layer in the region.

2. The light-emitting device according to claim 1, wherein the auxiliary wiring has a cross shape.

3. The light-emitting device according to claim 1, wherein the first electrode comprises a conductive high molecule.

4. The light-emitting device according to claim 1, wherein a thickness of the first electrode is less than or equal to 10 nm.

5. The light-emitting device according to claim 1, wherein the insulator comprises a resin.

6. A lighting device comprising the light-emitting device according to claim 1.

7. The light-emitting device according to claim 1, wherein the EL layer comprises a hole-injection layer, a hole-transport layer, a light-emitting layer, an electron-transport layer, and an electron-injection layer.

8. A light-emitting device comprising:
a first electrode over an insulating surface;
an auxiliary wiring over the first electrode;
an insulator covering a first side surface and a second side surface of the auxiliary wiring;
an electroluminescent (EL) layer over the first electrode; and
a second electrode over the EL layer,
wherein the first side surface of the auxiliary wiring is opposed to the second side surface of the auxiliary wiring,
wherein a region between the first side surface and the second side surface of the auxiliary wiring is overlapped with the auxiliary wiring, and
wherein the auxiliary wiring is in contact with the EL layer in the region.

9. The light-emitting device according to claim 8, wherein the auxiliary wiring has a cross shape.

10. The light-emitting device according to claim 8, wherein a thickness of the first electrode is less than or equal to 10 nm.

11. The light-emitting device according to claim 8, wherein the insulator comprises a resin.

12. A lighting device comprising the light-emitting device according to claim 8.

13. The light-emitting device according to claim 8, wherein the EL layer comprises a hole-injection layer, a hole-transport layer, a light-emitting layer, an electron-transport layer, and an electron-injection layer.

14. A light-emitting device including a first region and a second region, the light-emitting device comprising:
an auxiliary wiring over an insulating surface;
a first electrode over the insulating surface to cover the auxiliary wiring;
an insulator over the first electrode to cover a first step and a second step of a bump caused by the auxiliary wiring;
an electroluminescent (EL) layer over the first electrode; and
a second electrode over the EL layer,
wherein the first region is arranged beside the bump,
wherein the second region is arranged between the first step and the second step over the bump,
wherein both of the first region and the second region emit light.

15. The light-emitting device according to claim 14, wherein the auxiliary wiring has a cross shape.

16. The light-emitting device according to claim 14, wherein the first electrode comprises a conductive high molecule.

17. The light-emitting device according to claim 14, wherein a thickness of the first electrode is less than or equal to 10 nm.

18. The light-emitting device according to claim 14, wherein the insulator comprises a resin.

19. A lighting device comprising the light-emitting device according to claim 14.

20. The light-emitting device according to claim 14, wherein the EL layer comprises a hole-injection layer, a hole-transport layer, a light-emitting layer, an electron-transport layer, and an electron-injection layer.

* * * * *